(12) United States Patent
Madhavan (10) Patent No.: US 11,887,691 B2
(45) Date of Patent: Jan. 30, 2024

(54) TEMPORAL MEMORY SYSTEMS AND METHODS

(71) Applicant: University of Maryland, College Park, College Park, MD (US)

(72) Inventor: Advait Madhavan, Bethesda, MD (US)

(73) Assignee: UNIVERSITY OF MARYLAND, COLLEGE PARK, College Park, MD (US)

(*) Notice: Subject to any disclaimer, the term of this patent is extended or adjusted under 35 U.S.C. 154(b) by 35 days.

(21) Appl. No.: 17/492,524

(22) Filed: Oct. 1, 2021

(65) Prior Publication Data

US 2022/0108735 A1  Apr. 7, 2022

Related U.S. Application Data

(60) Provisional application No. 63/086,453, filed on Oct. 1, 2020.

(51) Int. Cl.
| | | |
|---|---|---|
| G11C 7/22 | (2006.01) | |
| G11C 7/10 | (2006.01) | |
| H03K 19/20 | (2006.01) | |
| G11C 7/12 | (2006.01) | |
| G06F 17/16 | (2006.01) | |
| G11C 5/06 | (2006.01) | |

(52) U.S. Cl.
CPC .............. *G11C 7/222* (2013.01); *G06F 17/16* (2013.01); *G11C 5/06* (2013.01); *G11C 7/1012* (2013.01); *G11C 7/1069* (2013.01); *G11C 7/1096* (2013.01); *G11C 7/12* (2013.01); *H03K 19/20* (2013.01)

(58) Field of Classification Search
CPC ..... G11C 7/222; G11C 7/1012; G11C 7/1069; G11C 7/1096; G11C 7/12
See application file for complete search history.

(56) References Cited

U.S. PATENT DOCUMENTS

| | | | |
|---|---|---|---|
| 5,010,401 A | | 4/1991 | Murakami et al. |
| 9,154,172 B1 * | | 10/2015 | Cruz-Albrecht ..... H01Q 3/2682 |
| 9,824,311 B1 * | | 11/2017 | Cruz-Albrecht ....... G06N 3/044 |
| 10,469,126 B1 * | | 11/2019 | Kilambi ................. H04B 1/709 |

(Continued)

OTHER PUBLICATIONS

Madhaven et al., "A 4-mm 2 180-nm-cmos 15-giga-cell-updates-per-second dna sequence alignment engine based on asynchronous race conditions." 2017 IEEE Custom Integrated Circuits Conference (Cicc). IEEE, 2017. 1-4.

(Continued)

*Primary Examiner* — Min Huang
(74) *Attorney, Agent, or Firm* — Quarles & Brady LLP (57) ABSTRACT

Various design concepts, circuit implementations, and methods are provided for implementing temporal memory. For example, temporal memories may perform both read and write operations using time-encoded wavefronts. A temporal memory may include a group of tunable delay components that "store" time-encoding information. Using these delay components, the memory can perform a "read" operation by outputting wavefronts having the same or similar time-encoding as the stored wavefronts. Temporal memories may allow for more energy-cost-efficient operation and may serve as building blocks for more complex temporal computational circuits.

13 Claims, 7 Drawing Sheets

(56) References Cited

U.S. PATENT DOCUMENTS

2009/0009211 A1* 1/2009 Ito .................. G06F 11/26 326/16
2022/0108736 A1* 4/2022 Madhavan .......... G11C 7/1096

OTHER PUBLICATIONS

Madhaven et al., "A truth-matrix view into unary computing." Proceedings of the 1st Unary Computing Workshop (ISCA'19). 2019. 1-4.
Madhaven et al., "Energy efficient computation with asynchronous races." Proceedings of the 53rd Annual Design Automation Conference. 2016. 1-6.
Madhaven et al., "Race logic: A hardware acceleration for dynamic programming algorithms." ACM SIGARCH Computer Architecture News 42.3 (2014): 517-528.
Madhaven et al., "Race logic: abusing hardware race conditions to perform useful computation." IEEE Micro 35.3 (2015): 48-57.
Madhaven, Advait. Abusing Hardware Race Conditions for High Throughput Energy Efficient Computation. University of California, Santa Barbara, 2016. 1-141.
Najafi et al., "Low-cost sorting network circuits using unary processing." IEEE Transactions on Very Large Scale Integration (VLSI) Systems 26.8 (2018): 1471-1480.
Smith, James E. "(Newtonian) Space-Time Algebra." arXiv preprint arXiv:2001.04242 (2019). 1-22.
Smith, James E. "A neuromorphic paradigm for online unsupervised clustering." arXiv preprint arXiv:2005.04170 (2020) 1-13.
Smith, James. "Space-time algebra: A model for neocortical computation." 2018 ACM/IEEE 45th Annual International Symposium on Computer Architecture (ISCA). IEEE, 2018. 289-300.
Tzimpragos et al., "A computational temporal logic for superconducting accelerators." Proceedings of the Twenty-Fifth International Conference on Architectural Support for Programming Languages and Operating Systems. 2020. (pp. 435-448).
Tzimpragos et al., "Boosted race trees for low energy classification." Proceedings of the Twenty-Fourth International Conference on Architectural Support for Programming Languages and Operating Systems. 2019. pp. 215-228.
Tzimpragos et al., "From arbitrary functions to space-time implementations." Proceedings of the 1st Unary Computing Workshop (ISCA'19). 2019. 1-4.

* cited by examiner

TEMPORAL MEMORY SYSTEMS AND METHODS

CROSS-REFERENCE TO RELATED APPLICATIONS

This application claims priority to U.S. Provisional Application No. 63/086,453, filed on Oct. 1, 2020, which incorporated herein by reference in full.

STATEMENT REGARDING FEDERALLY SPONSORED RESEARCH

This invention was made with government support under 70NANB14H209 awarded by the National Institute of Standards and Technology. The government has certain rights in the invention.

BACKGROUND

The present disclosure relates in general to improvements in how computers compute. At present, the vast majority of computational components across the computational stack (e.g., circuits, architectures, and other mid- to high level-abstractions) used in electrical devices (e.g., CPUs, GPUs, ASICs, FPGAs, memory, registers, and other digital circuit components) use a digital, clocked scheme for storing data and performing operations. However, progress in making improvements to these classical components has stagnated as progress on transistor design and performance has slowed.

While much of the innovation in the computational field has recently been aimed at improvements in the lower levels of existing computational stacks (e.g., adding processing cores, more application-specific co-processors, memories adapted for specific functions, etc.), the inventors have reassessed and developed a fundamental change to how data is encoded in physical states and propose practical frameworks for leveraging this change into usable constructs. For example, the present disclosure deals with various implementations that use arrival-time encoding schemes, such as race logic. This provides significant advantages in efficiency and other measures of computational success.

An arrival-time encoding known as race logic is described herein. Since digital transitions (edges) account for much of the energy consumption in traditional computation, race logic encodes multi-bit information in a single edge per wire. The arrival time t of this single edge is the value encoded by the signal. Encoding multiple bits on a single wire makes some operations very simple to implement.

To date, development of race-logic-based architectures has been largely ad hoc. For example, race logic was first developed to accelerate dynamic programming algorithms, and it has been proposed for applications including some proposed uses in various types of software networks (e.g., machine learning). However, device technologies have lagged and thus, this encoding scheme is still not generally adopted or feasible. It would therefore be desirable to have a practical, systematized method of building computer architectures that utilize race logic encoding. one important building block for implementation of a computer architecture relying on time-encoding would be an efficient and reliable time-encoded memory.

SUMMARY

The present disclosure provides systems and methods for implementing memory via temporal encoding and/or race logic.

In one implementation, a temporal memory is provided, which comprises: a group of tunable delay components in electrical communication with a set of input lines and a set of output lines; a write circuit connected to the tunable delay components such that an electrical signal can be controllably applied to each of the tunable delay components in correspondence with relative timing of a set of arriving wavefronts at the input lines associated with the tunable delay components, wherein the set of arriving wavefronts temporally encode data in their relative delay; and a read circuit connected to the tunable delay components such that an output signal can be controllably conducted through the tunable delay components so as to cause a set of memory recall wavefronts to be generated at the set of output lines having a relative delay corresponding to the relative delay of the set of arriving wavefronts.

In another aspect, the present disclosure provides a method for storing data in a temporal memory comprising: receiving a set of electrical input pulses, wherein each electrical input pulse of the set of electrical input pulses has a time delay, the set of electrical input pulses encoding a plurality of data bits; tuning a set of delay components of the temporal memory according to the time delay of each of the set of electrical input pulses, such that the temporal memory stores the plurality of data bits as tuned delay; receiving a read signal; in response to the read signal, generating at least one electrical output pulse for each of the delay components in the set of delay components; via the delay components, delaying the at least one electrical output pulse to create a set of electrical output pulses having substantially the same relative time delay as the set of electrical input pulses; and outputting the set of electrical output pulses.

The present disclosure also provides a circuit comprising: an input circuit to receive temporally-encoded wavefronts; circuitry configured to program RC delay in accordance with temporal delay of the temporally-encoded wavefronts; and an output circuit to delay output wavefronts using the programmed RC delay.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Various systems and methods are disclosed herein for overcoming the disadvantages of the prior art. The systems and methods herein implement various features and aspects that make them useful for any situation in which it would be beneficial to implement computational components or architectures in the time domain or which would otherwise utilize or benefit from temporal memory. For example, these systems and methods could find application via a memory component or network of memory components.

Considered in one sense, the three pillars that form the foundation of a computing system are computation, input/output (I/O), and memory. The present disclosure relates to circuits and associated architectures, methods, and constructs that allow for data storage (memory) natively in the temporal domain.

The temporal domain allows for different encoding schemes, among which two general categories are contemplated. One is a timing code, where the exact delays between electrical "spikes" within a circuit carry information. A more relaxed version of such an approach, though less dense in coding space, is a rank order code, in which only the relative orderings of the spikes carry information. Though sparser than its exact timing counterpart, order codes can contain appreciable information capacity while still maintaining robustness to variations in individual spike timing.

The present disclosure will describe developments and implementations in which time-encoded data can be written and recalled from memory. Various types of circuits and computational constructs can then be developed leveraging the features disclosed herein.

Having memories that can directly interface with the temporal domain, allows for read and write operations in such a memory can be performed without conversion to digital encoding, as described herein.

The introduction of temporal memory technologies herein allows race logic to serve as an efficient computational construct. A temporal computer equipped with a temporal memory is no longer subject to the invariance constraint on time-coded functions. Lifting this restriction allows for new, and more suitable mathematical foundations to serve as a coherent context for designing and interfacing race logic circuits. Temporal memories also allow for the building of more general-purpose, and complex architectures, beyond specialized one-shot temporal computations.

Application of Race Logic Principles

As described herein, race logic can be thought of as a regime that uses biologically inspired wavefronts (as opposed to prior techniques using timing relationships between spikes) as the fundamental data structure, while using conventional digital CMOS circuits to compute. Race logic encodes information in the timing of rising digital edges and computes by manipulating delays between racing events. In contrast, in the conventional Boolean domain, the electrical behavior of wires changing voltage from ground to $V_{dd}$ is interpreted as changing from logic level 0 to logic level 1 at time t. In race logic, these wires are understood to encode each t as their value, since the rising edge arrives at t with respect to a temporal origin at t=0. (In some cases, a voltage edge can fail to appear on a wire within the allotted operational time of a race logic computation. In these cases, we assign the value temporal infinity, represented by the ∞ symbol.)

Some description of the background or existing perception of race logic as applied to circuit design will be helpful. Most discussion of race logic involves consideration of this scheme without memory—this can be called "pure race logic" design. The classes of functions that are candidates for implementation in pure race logic is constrained by physics through causality and invariance. For example, any output must be caused by an input that arrives prior to or simultaneous with the output; and outputs are invariant in the sense that they will output a result regardless of temporal origin of the input.

However, the various embodiments described in the present disclosure is not subject to theses constraints because they utilize memory. Thus, designs using the concepts of the present disclosure can be thought of as "impure" or "state" based race logic. Circuits using the principles described herein can perform differently at different times, depending on whether a memory element has been modified. From a programming perspective, a pure function always gives the same output when presented with the same input; an impure function is analogous to a subroutine that can access and modify global variables.

Examples of Temporal Memory

Various embodiments that implement the concepts and advantages presented in this disclosure can be utilized in a variety of computational environments. For example, a temporal memory implementation could be interfaced with digital components, to store information that is temporally-coded, but which is converted to digital coding after being read, in order for processing by a typical digital processor. In other embodiments, a temporal memory implementation could be used in an all-temporal, or substantially-temporal computing environment.

In general concept, temporal memory embodiments can be configured so that their circuit components cause a timing difference or delay as between outputs (wavefronts) generated on output lines of the memory device during a read operation. The delays can be detected (either in an absolute sense or relative to the output of the other lines or relative to another independent event like a clock cycle(s)), and interpreted as encoded data stored by the memory. The data is "stored" in the temporal memory embodiments as electrical features of the device that cause the variable time delay in output, such as programmable resistance. In a sense, programming delay (or resistance) into a memory device can be thought of as akin to writing or encoding information into the memory. Both the "write" and the "read" functionality of a temporal memory can be performed using time domain information, or one or both of these operations can be facilitated using more typical digital/clocked circuits.

Therefore, using the techniques and designs described herein, a useful translation between static memory and timing signals can be achieved. In other words, data that is encoded through an event arrival can be captured in a static format, then regenerated/recalled with the same relative arrival information. This allows for temporal-based memory as well as operation and computational functions to be performed entirely in the time domain, wherein data is encoded not in the classic Boolean (high/low, clocked signals) sense but entirely in the temporal domain.

In some embodiments, the translation of time-encoded event information into static memory can be achieved using tunable memristor RC time constants. Example 1, below describes how 1T1R memristive crossbars and other circuit configurations can be used to create wavefronts that have been stored in them that still retain the same time-encoded arrival information. Such an approach can interrogate the memristive state with more energy efficiency than conventional techniques. In some embodiments, the relative timing information in a wavefront can be captured through standard digital circuit techniques, which then invokes specific write circuitry to tune the memristor resistances to the corresponding captured digital values. This domain shifting, from analog to digital and back, has significant overhead associated with it. An alternative embodiment in which a circuit can natively capture wavefronts directly into memristors is also described.

Implementation of temporal computing techniques as described herein allow for creation of advantageous features in a temporal memory circuit component. For example, a temporal memory is possible that operates in the sub 50 ns timing range while utilizing the low variability, low resistance states (10 kΩ to 40 kΩ) of memristive devices. The recalling/playback operation of such devices can have an energy cost of about 400 fJ per line, whose magnitude is independent of the device conductance. Some embodiments may implement rank order coded architectures to achieve advantageous error tolerance. As described herein, embodiments of temporal memories can serve as foundational building blocks of temporally-coded computing architectures.

Figure 1A:
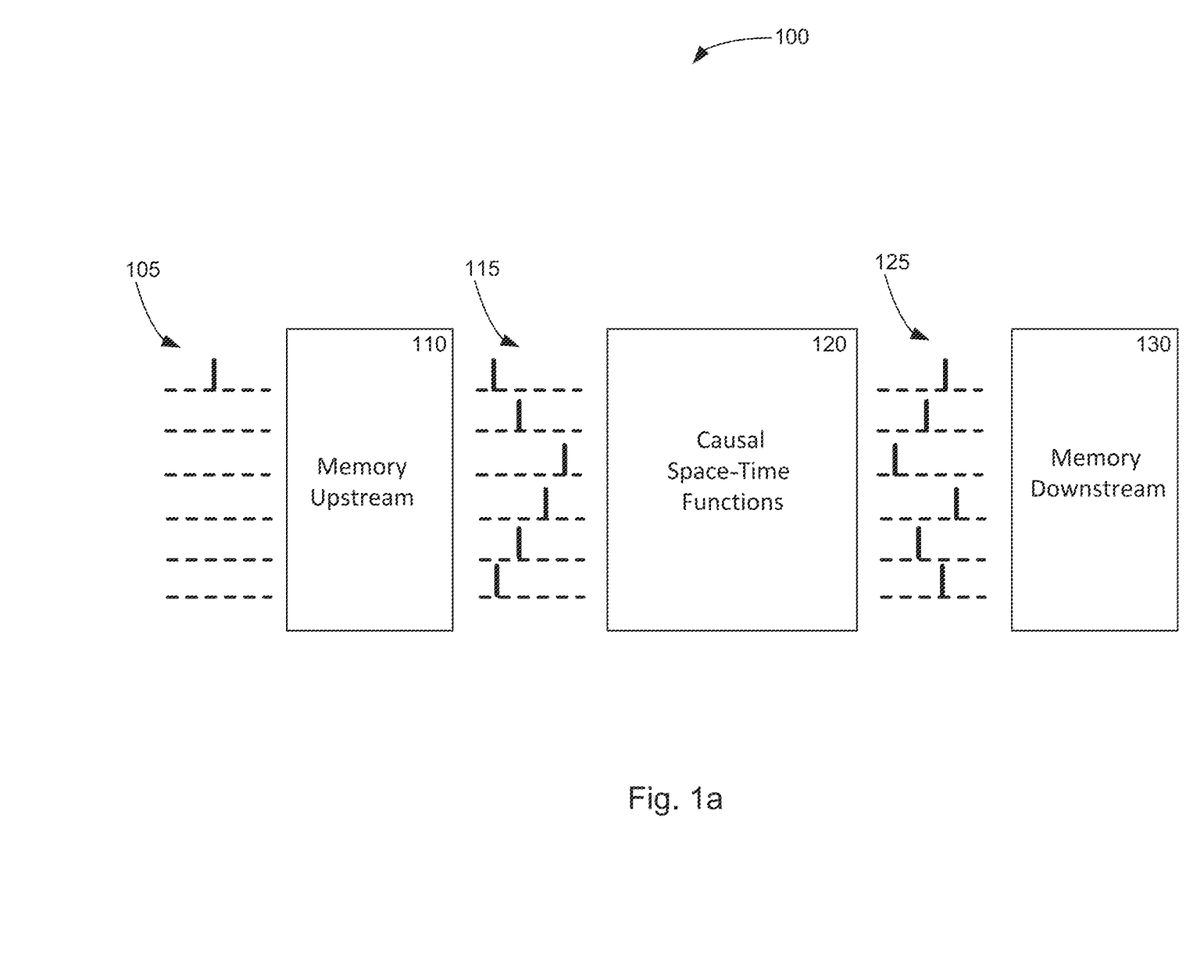
FIG. 1(a) is a conceptual diagram of temporal computation procedure, showing how temporal logic is used to encode and store information before and after temporally-implemented functions.
Figure 1B:
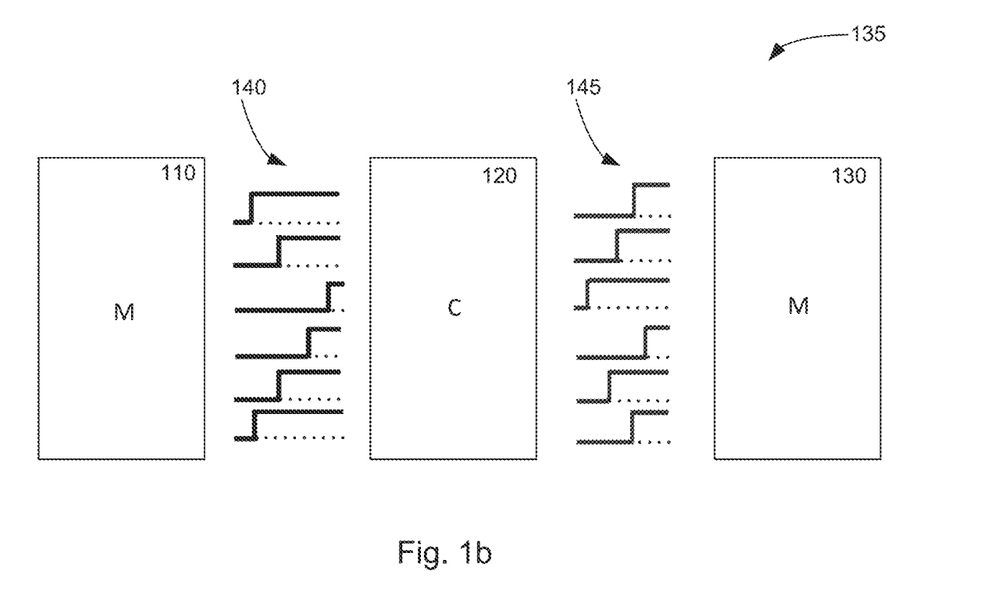
FIG. 1(b) is a conceptual diagram depicting temporally-implemented computational circuits and memories that represent events with digital rising or falling edges.
Figure 1C:
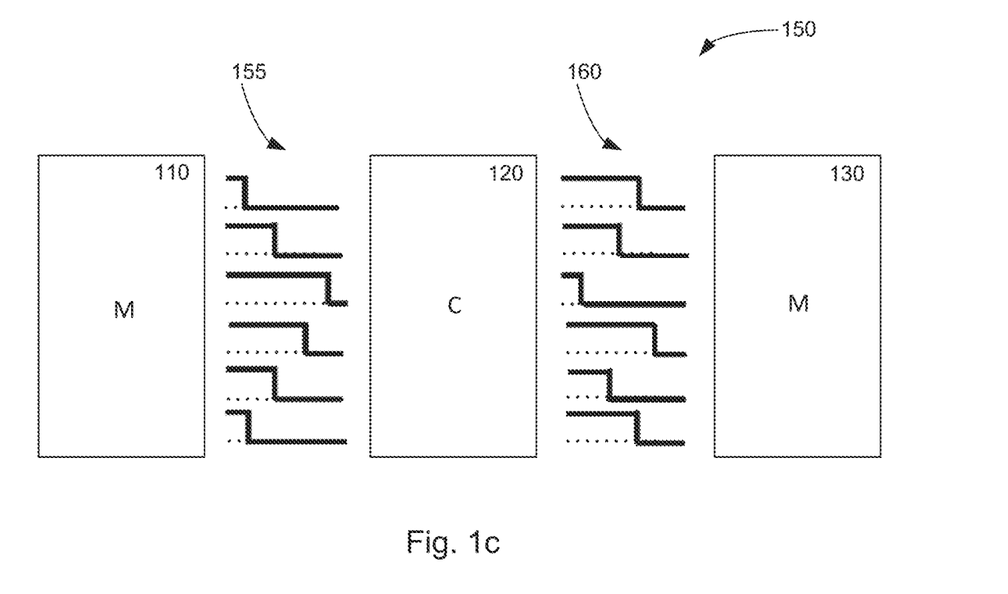
FIG. 1(c) is a conceptual diagram depicting temporally-implemented computational circuits and memories that represent events with digital rising or falling edges.
Figure 2A:
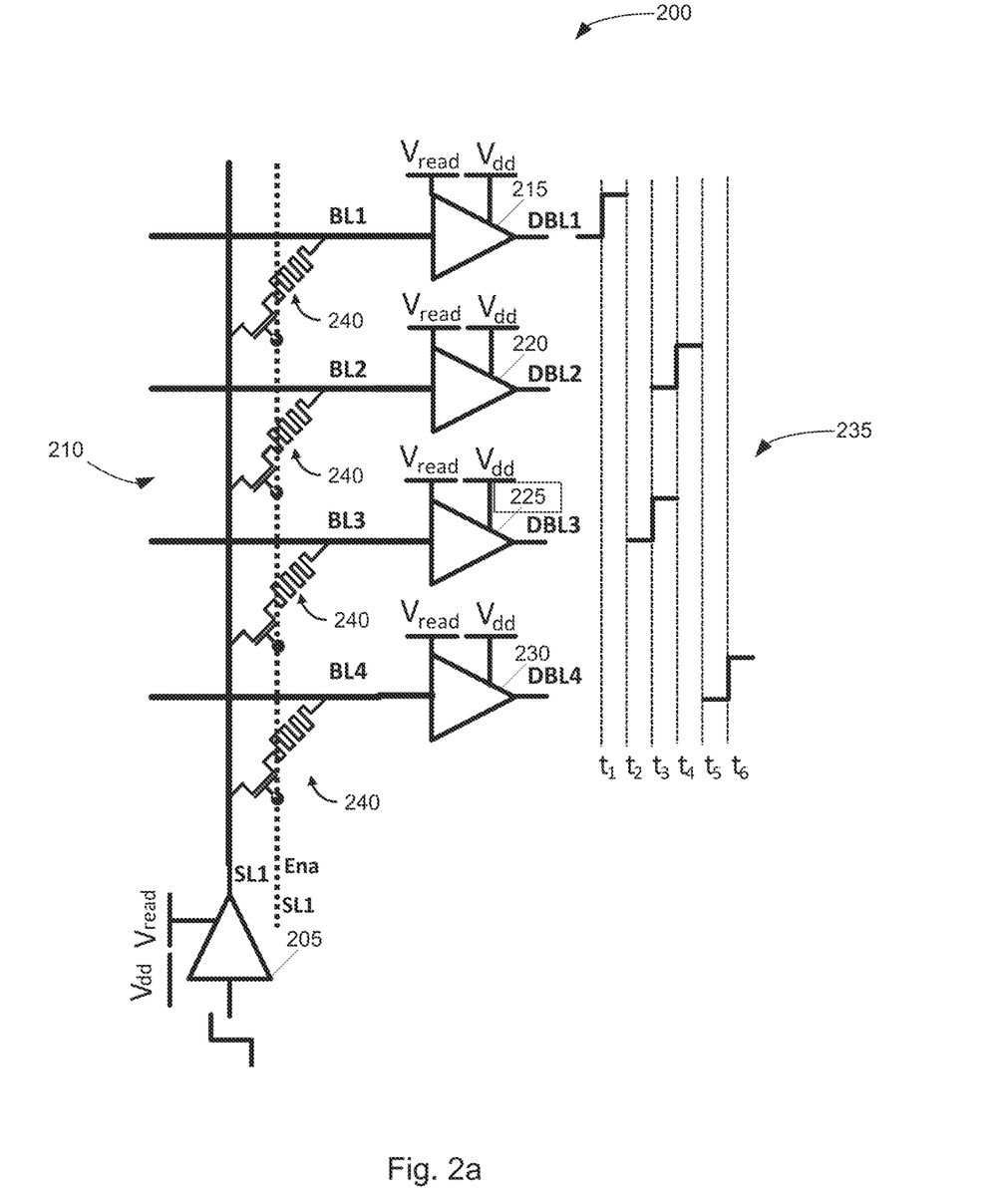
FIG. 2(a) is a conceptual schematic showing a single column temporal memory circuit performing a read/recall operation.

In one embodiment, a temporal memory can be used in a temporally coded environment where rising edges are used to demarcate events. Referring now to FIG. 2(a) a single column 210 of a scalable temporal memory architecture 200 is shown. The architecture 200 uses a 1T1R memristor crossbar 240, though other components could also be used to achieve the functionality described herein. For example, one approach could be to use programmable CMOS-only delay elements. Another approach could be to use magnetic domain wall memories, which also behave like delay elements. As shown in FIG. 2(a), each row behaves as an output bit line 215, 220, 225, 230 and the column behaves as the input source line (designated as "SL1"), however it is to be understood that such a 2D orthogonal structure is not required and other orientations (e.g., vertical and horizontal, through layers of a chip, at non-perpendicular angles, etc.). When a rising edge (e.g., a line goes "high" or moves to an elevated voltage) arrives through an enabled source line SL1, it charges the output bit line (BL1-4) capacitor, through the memristor, until a threshold is reached, causing a rising edge at the digital bit line (DBL).

Figure 2B:
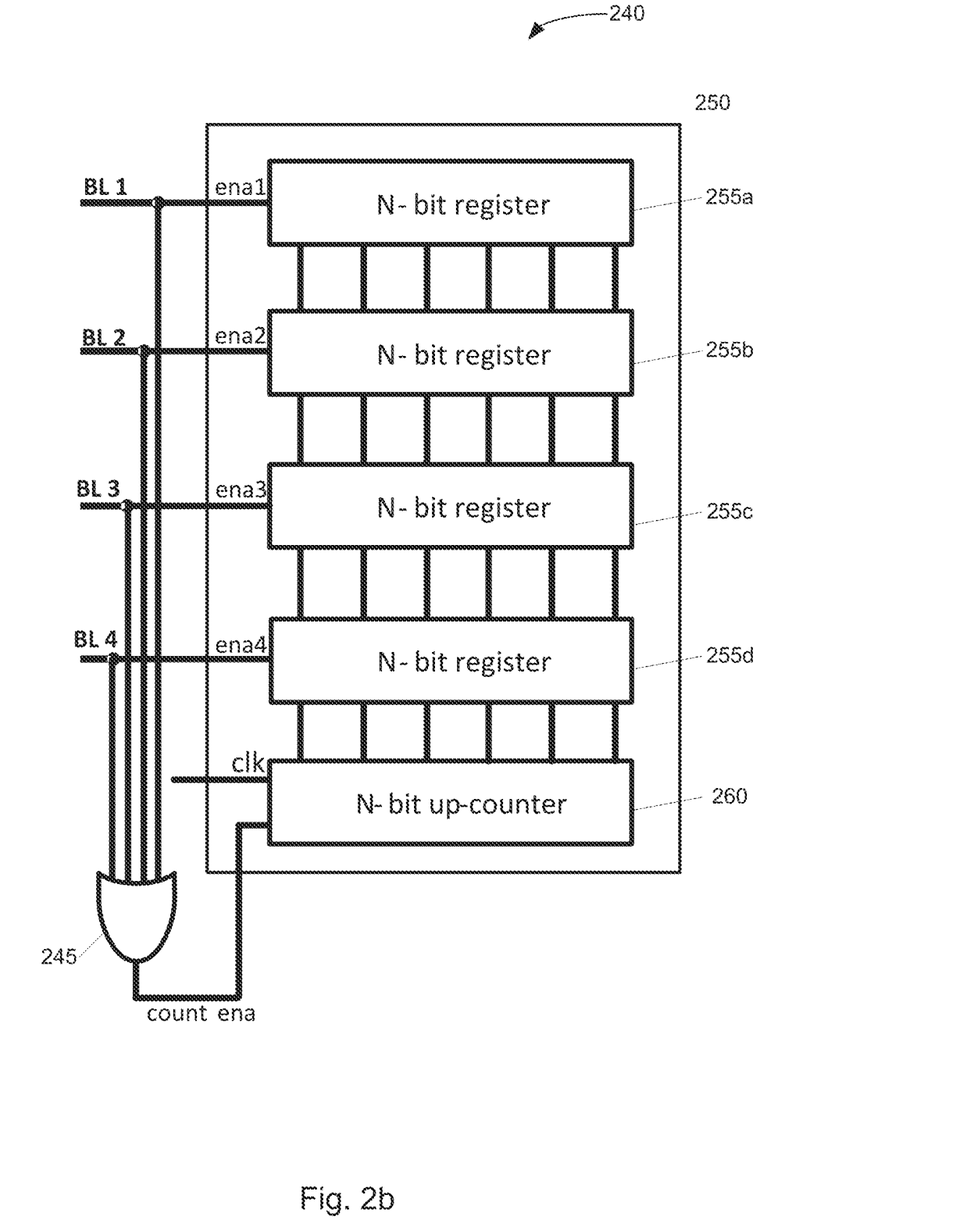
FIG. 2(b) is a conceptual schematic showing a detection circuit for detecting and storing incoming wavefronts from bitlines.

A read/recall operation is shown in FIG. 2, wherein a rising edge is presented at the input of the source line driver 205 (in the configuration shown, this is a levelshifter). This results in different charging rates of the various bit lines BL1-4, determined by the respective cross-point devices 240, resulting in an output wavefront. This wavefront enters the bitlines of FIG. 2(b) where the OR gate 245 detects the first arriving edge, starting the up-counter 260. The incoming rising edges on the bit lines BL1-4 latch the counted values and hence store the incoming wavefront as a digital value in N-bit registers 255a-d. Therefore, it is to be recognized that the embodiment in FIG. 2 leverages both some components operating in a temporal domain, as well as some components (e.g., the registers 255 and counter 260) that operate in a classical digital/Boolean regime. In other words, the binary/bit values stored in the N-bit registers 255a-d will correspond to the difference in time of arrival of the outputs of the temporal memory column on bit lines BL1-4.

Using such a circuit 200, the values of the memristive states can be directly read out as a wavefront of digital rising edges, also known as wavefront recalling. This is shown in the graph portion of FIG. 2(a), where a linear variation in memristive values leads to a linearly spaced output wavefront. The way in which memristive components 240 are used in this configuration differs in some important ways from conventional approaches. When used in a multilevel memory or feed-forward inference context, a static read voltage is applied across the device (pinned with a sense/measurement amplifier) while the resultant current is summed and measured.

Hence, the energy efficiency in these approaches improves the larger the Ron and $R_{off}$ resistances become. In contrast, in this RC charging based recall mode of operation, the voltage drop across the device is not static, because the voltage on the output capacitor changes during a read operation (See FIG. 4(b)(iii)). This changing voltage has several advantages. First, it decouples the energy cost per read operation from the value stored in the memristor. Independent of the state of the device, a single read operation consumes $CV_{read}^2$ (≈400 fJ) of energy per line, with $CV_{read}^2/2$ lost due to joule heating across the memristor and $CV_{read}^2/2$ stored on the capacitor. This data independent energy cost allows memristors to be used in the high conductance regime, without incurring the typical energy cost. Circuit and architectural designs can then take advantage of the high conductance regime, where the behavior of the device is more linear, repeatable and less susceptible to variation. Recently, for very low resistance states, the device to device variation has been shown to be ≤1%.

Another advantage is that the degree of read disturb on the device is reduced as the full read voltage is applied across the device for a relatively short period of time. To enable easy interface with digital signal levels, level shifters can be used to translate between the computational digital voltage levels, and voltage levels that are compatible with memristive devices. This involves, shifting down from $V_{dd}$ to $V_{read}$ and back up to $V_{dd}$. This shifting down process can be implemented with regular inverters but the shifting up process may utilize either current mirror based level-shifters or cross coupled level-shifters. The current mirror based designs have a smoother response, and consume static power while the cross coupled versions are more power efficient, but have a more complicated response.

Figure 3:
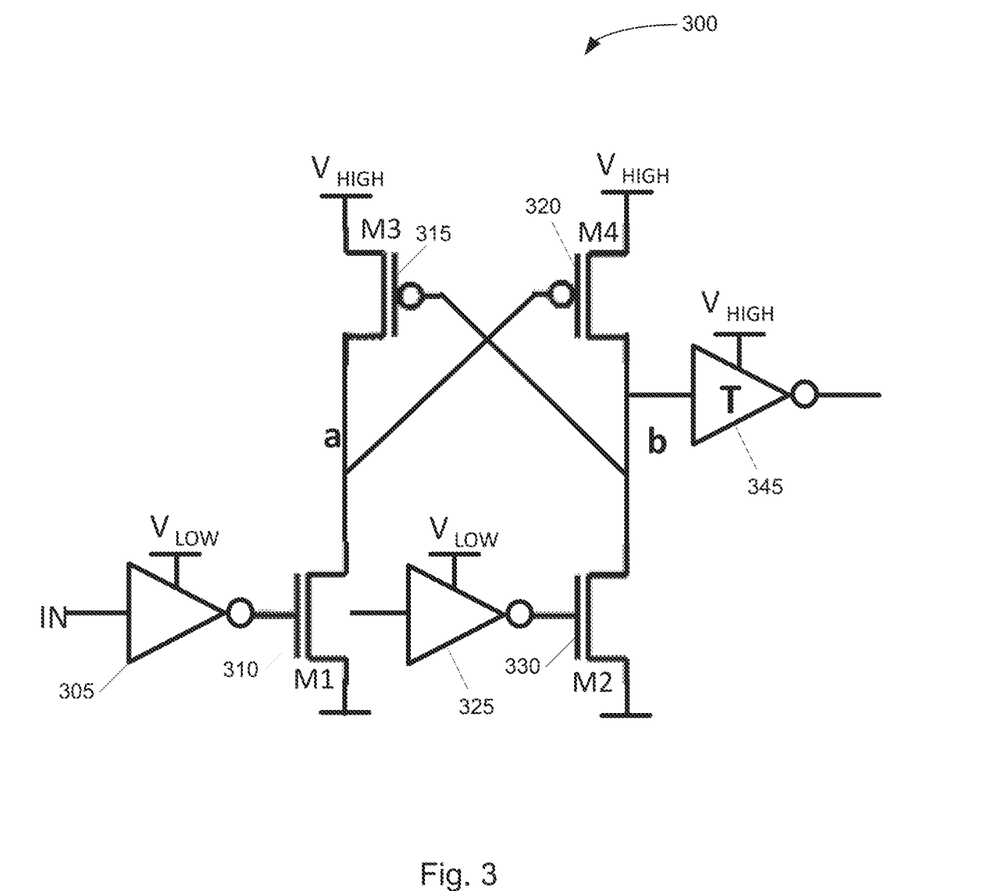
FIG. 3 is a circuit schematic for an example of a rising edge level shifter.

Referring now to FIG. 3, a cross coupled topology/configuration is shown. FIG. 3 depicts a circuit diagram of an asymmetric rising edge level shifter 300. The transistor M2 is sized larger than its counterpart M1 such that node "b" is pulled down faster with little competition from M1 via node "a". The inverter with a "T" represents a tri-state buffer 345. This circuit in FIG. 3 is representative of a positive feedback loop between transistors M1-M4. This positive feedback loop itself has a time constant that varies with the current charging the input node. This variable time constant can add timing uncertainties that are data dependent and could cause errors. Some implementations can mitigate this problem by taking advantage of the one sided nature of this information encoding. Using rising edges only determines the transistor that is responsible for the pull-down so it can be sized accordingly larger. This approach makes the response of the level shifter more uniform.

In some embodiments, digital circuit techniques as shown in FIG. 2(b) can be used to record wavefronts. High speed upcounters can be used for time scales on the order of 1 ns to 50 ns, and vernier delay lines, which extend the precision to the order of a single-inverter-delay, can be used for more precise measurements. Using Race Logic principles, the first arriving edge is detected with an OR gate, which signals the beginning of the timing measurement system (counter or Vernier delay line). With each subsequently arriving rising edge, the corresponding count value is captured in a register bank. An AND gate signals the last arriving input, at which time the recording process comes to an end with a digital representation of the relative arrival times with stored in a temporary register bank. These values can be used as targets for a closed loop feedback programming approach that writes the corresponding values into the correct memory column.

In other embodiments, using the variation of memristor resistances resulting from applied current pulses, the energy efficiency of wavefront recording is increased by eliminating the need to translate between encoding domains. In other words, a "native" time domain approach can be used. This native approach to capturing wavefronts, which exploits the close relationship between memristors and STDP, results in a natural and energy efficient implementation. In a time coded information representation, in which the value of the memristors explicitly codes for delay, STDP-like behavior can be used to record wavefronts. In this approach, the circuit applies pulses of variable lengths across the memristors proportional to the difference in timing between the first arriving event and the event in question. When a wavefront is then recalled, the highest conductance device responds first and the most resistive one responds last, preserving the wavefront shape/timing.

Figure 4A:
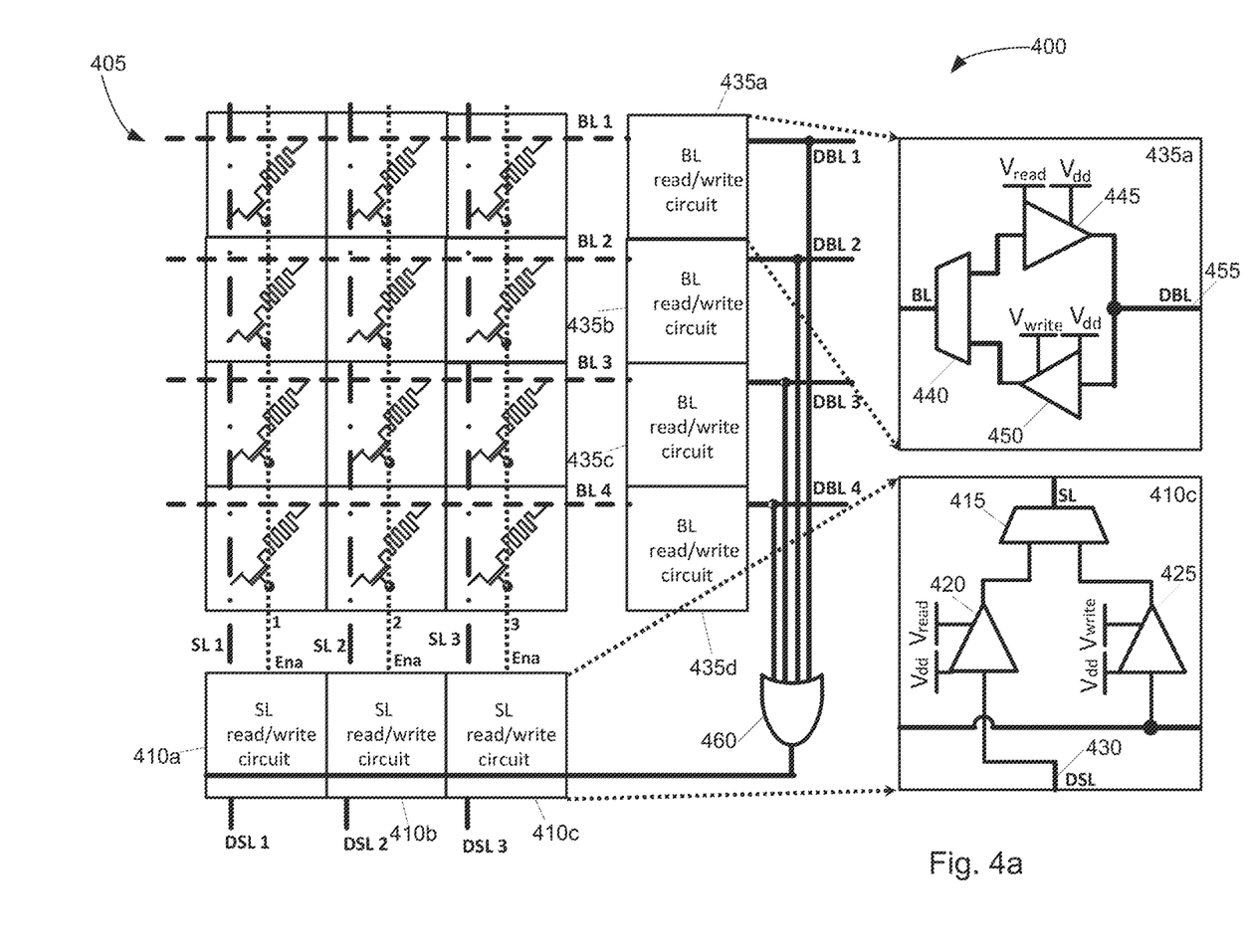
FIG. 4(a) is conceptual schematic of a temporal memory array, with detailed expanded views of read/write circuit units.

Referring now to FIG. 4(a), an exemplary circuit structure 400 is shown that achieves some of the advantages described herein. As shown the structure 400 implements a 3×4 resistive temporal memory. An 1T1R array 405 is shown, in which a memristor cross bar connects to row and column lines. The lowermost 410 and rightmost 435 grouping of cells represent the source and bit line augmentations that allow for use of such an array in a temporal context. These cells 435 and 410 are read/write circuits. A zoomed-in depiction 435a, 410c of a cell from each grouping is also shown, in order to show the level shifters (digital) and read out cells (tri-state). The multiplexers 440, 415 that determine the read/write circuit paths are pass gate based.

To write data to the memory device, the bit-lines (BL1-4) are used as inputs, and the source lines (SL1-3) are controlled by the OR gate 460 through the write path of the multiplexers 440, 415. Given the OR gate 460, so long as any BL is high, the SLs will also all be high. Therefore, when any given BL is low (but at least one other BL is high, thereby triggering the OR gate and the SLs), a voltage difference across a memristor coupled to that BL will be present, which will cause a change in the resistance of the memristor. As described below, there may not be a completely linear change in resistance, depending on materials used. After a given period of time at which all BLs are high, they will all drop to low at the same time. During read/playback, the source lines SL1-3 are used as the inputs, with the bit lines BL1-4 being the outputs, with the multiplexers 440, 415 operating in the read path. When the source line goes high (for all columns/rows), the memristors at each node in the array 405 will cause a delay in the time it takes to output onto the BL—and the delay will reflect the programmed delay caused by the wavefront differences during the write phase. Thus, the multiplexers allow for the SL and BL to be used differently for the read phase versus the write phase.

Figure 4B:
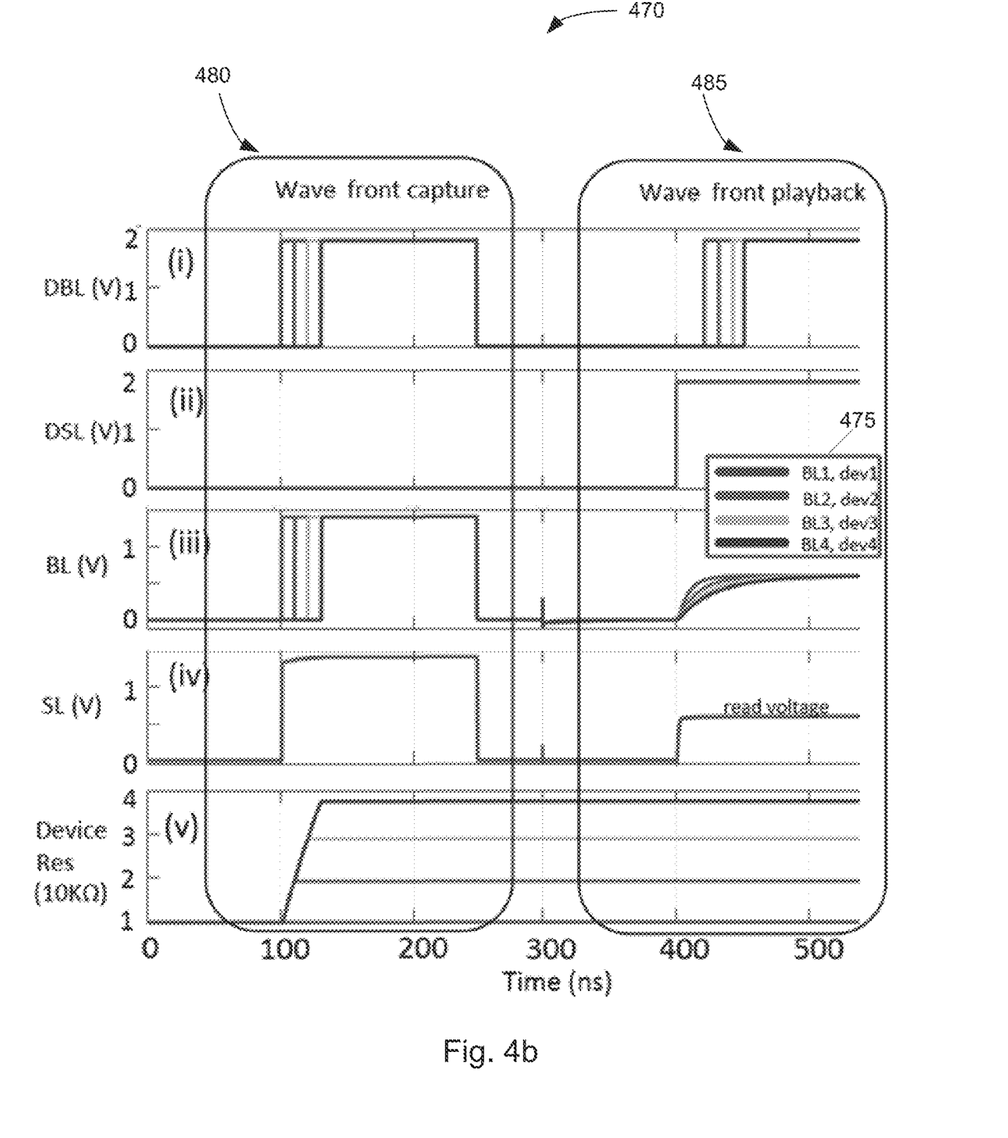
FIG. 4(b) is a set of graphs showing example operations performed via a temporal memory array.

Simulation results for such a procedure are shown in FIG. 4(b) for the wavefront capture (write) phase 480 and wavefront playback (read) phase 485. These simulations are performed in a 180 nm process node, with a 1.8V power supply. The memristor models used were metal-oxide-based resistive random access memory (RRAM) devices and were modelled based on experimental measurements. The wavefront recording operation proceeds by first initializing the column in question, (column 1, shown in FIG. 4(a)), with all memristors set to the ON state (≈10 kΩ) and the enable line (Enal) activated. This can be seen in the first 100 ns of FIG. 4(b)(v) with all devices having the same impedance. The write path through the multiplexers, as shown in FIG. 4(a), is also activated, such that the OR gate controls the source line (SL). The wavefront (having a dynamic range of 40 ns) to be recorded is presented at the digital bit lines (DBLs), which behave like the input in this phase of operation. Similarly to the digital case of FIG. 2, the first arriving rising edge is detected by an OR gate, which triggers the application of an appropriate write voltage ($V_{write} \approx 1.4$ V), through the multiplexer, to the source line (SL). The bit-lines (BLs) of the array are operated in the write voltage regime with rising edges level shifted down from $V_{dd}$ to $V_{write}$. Each device sees the difference in voltage between the source line (FIG. 4(b)(iv)) and corresponding bit lines (FIG. 4(b)(iii)) applied across it. For the tunable delay device corresponding to the first arriving edge, both its source line and bit line go high at the same time, so there is no change in the memristive state. On the other hand, for the other tunable delay devices, for which the edges have not arrived yet, a reverse $V_{write}$ voltage is applied across them for the difference in time between the arrival of their corresponding edge and the first arriving edge, causing a change in the memristive state proportional to the relative times between the inputs.

Once the recording operation is complete, the last arriving edge has its corresponding device experience the longest write pulse and hence has a maximal change in state and is the most resistive, while an intermediate device sees a proportional change in resistance. Similarly, after the appropriate pulse lengths have been successfully applied across the devices, a copy of the input wavefront should be captured into the memristive devices.

Some embodiments may experience various phenomena in the context of exact timing codes that it may be desirable to address. First, in some embodiments the relationship between memristor resistance and relative output timings for recalling the wavefront might be linear, arising directly from the t/RC relationship; but the relationship between memristor conductance and voltage pulse duration for recording the wavefront may not be not linear, and may depend on material properties. Since most memristive state change dynamics are governed by transitions over energy barriers, the effectiveness of a fixed voltage to change the device state drops logarithmically. In the wavefront recording process, a linearly spaced input wavefront will end up creating a logarithmically spaced resistive change, which when recalled would create a logarithmically spaced output wavefront. This problem is fundamental to some configurations, being governed by the exponential nature of Boltzmann statistics and energy barriers.

One way to get linear behavior out of such a device, is to cause it to operate in a regime where the Taylor series expansion of its behavior has small higher order coefficients, so that it can be approximated as linear. Such behavior can be seen for a range of voltages where a sharp pulse (≤40 ns) across the device creates a linear change in the device's state (from 10 kΩ to 40 kΩ), which tapers off if the pulse is applied for a longer time. Here, as shown in FIG. 4(e)(v), pulse duration is calibrated to access that specific linear region of the memristor characteristics, and therefore does not access the complete available dynamic range.

The reduced range is not detrimental and depends on the quality of the memristive devices being used. Five bit or more resolution is possible in limited resistance ranges with the low resistance state incurring, programming cycle to cycle variations as low as 4.2% and device to device variation as low as 4.5%. For very low resistances (between 1 kΩ and 10 kΩ), even lower variation numbers are possible (≤1%). Such technological improvements allow for the extraction of 4 to 5 bits of precision, even from a reduced dynamic range.

A second difficulty for exact timing codes is that the time scales of recording and of recalling should ideally match, or come close to matching, in some embodiments. For example, the resistance change created by 10 ns pulses in the recording process, should ideally create 10 ns spaced edges when recalled. While the former is a material property and won't be directly changed by circuit techniques alone, the latter can be addressed by adding digitally programmable capacitances (≈1 pF, in the current simulation) on the output line to correctly scale the timescale. For small array sizes such a capacitance can take up extra area, but as the array is scaled to more representative sizes, the crossbar, transistor-drain and driver capacitances will contribute significantly to this capacitance. Scaling of the array is relatively straight-forward, with the timing of the read drivers being correctly calibrated as described previously. The write drivers on the bit line do not need to be adjusted, but the source line write driver will have to be designed to support N memristors in parallel during the capture phase. A more detailed scaling analysis accounting for crossbar wire resistances and capacitances is also contemplated.

Neither of these problems are as significant concerns for rank order codes as they are for exact timing codes. Logarithmic compression preserves order, and variable capacitances can be used with order codes to stretch the logarithmically compressed stored values. This method allows enough write pulse duration to still change state on the next write operation. This makes rank order codes a more robust and error tolerant application for this kind of a temporal memory.

Accordingly, a number of configurations and implementations of a temporal memory have been shown and are contemplated. Some principles described herein are common to many embodiments: For example, a tunable delay component operable for one or more bit lines (e.g., some bit lines may be combined, and some may have fixed delay) of a memory is generally included, so that the tuned delay can correspond to the differences in wavefronts arriving at the memory. The tunable delay components can be circuits that provide RC delay. In some embodiments the wavefronts may be pulses of equal or similar voltage differential (e.g., "high" pulses akin to a digital environment), but delayed in time. Thus, as described above, tunable delay components "see" the incoming pulse delay differences by receiving a voltage differential for different periods of time. In the case of memristors as the tunable delay component, the resistance of the memristors is directly impacted by duration for which these voltage differentials are applied. However, in other embodiments, other time-based components of wavefronts may also be utilized to store time domain information in tunable delay components, and other tunable delay components could be used. For example a number of wavefronts that all arrive at a memory at the same time, but which have differing rise/fall times could also be used to program delay components in the same fashion. Likewise, a write component of the memory is also common to many embodiments. In embodiments described herein, these circuit components aid in translating the time differential of incoming wavefronts into an electrical feature that is applied to tune the tunable delay components. For example, as described above with respect to FIGS. 2 and 4, aspects of the circuits shown therein associated with the source lines cause a voltage differential across the memristive crossbar that corresponds to timing of arriving wavefronts. And, similarly, write/recall components of the memory devices allow for discharge of wavefronts along bit line outputs of the memory that are delayed according to the tuned delay components. In some embodiments, a rising edge is presented at a source line driver. In other embodiments, a stored charge can be used to generate rising edges for each output bit line.

Likewise, embodiments disclosed herein may operate according to similar modes of operation and methods for storing data. Generally speaking, in many embodiments a set of electrical input pulses (time domain-encoded, e.g., for race logic design, per the description herein) is received. The time delay characteristics of the pulses encodes data bits, with each pulse potentially encoding multiple bits (e.g., 4 or 5 bits, or up to 6 or 7 bits, or higher depending on sensitivity of the circuit components and materials used). The embodiments use these electrical input pulses to "tune" a set of delay components, in any of the techniques contemplated herein. For example they may program a CMOS-only circuit, or tune a memristor, etc. Once the tunable delay components have been tuned, they are in essence storing the encoded data bits. This is, as described above, a "write" or "store" phase of memory operation. Importantly, the temporally-encoded information is now made static, by the method. Then, at some point, when embodiments herein are to perform a "read" or "recall" operation (e.g., a memory is interrogated), then they generally will receive a read signal. In response to that read signal, embodiments herein generate an electrical output pulse for each of the delay components. As described above, there are several ways in which the output signals can be generated, e.g., by discharging capacitors, by applying read signals, by stepping down a $V_{dd}$ signal, etc. This signal is delayed by the delay components so that the embodiments can output a set of electrical output pulses having substantially the same relative time delay as the set of electrical input pulses. The foregoing method steps can be carried out by a variety of circuits and components, including the examples identified above.

Various designs, implementations, and associated examples and evaluations of temporal domain memory components have been disclosed. The framework for temporal memory design presented herein addresses the limitations of existing work and pushes the state-of-the-art forward through its innovative, and flexible design that allows for all or partial aspects of memory read/write to be performed in the time domain. However, it is to be understood the present disclosure has been presented in terms of one or more preferred embodiments, and it should be appreciated that many equivalents, alternatives, variations, and modifications, aside from those expressly stated, are possible and within the scope hereof.

What is claimed is:

1. A temporal memory comprising:
a group of tunable delay components in electrical communication with a set of input lines and a set of output lines;
a write circuit connected to the tunable delay components such that an electrical signal can be controllably applied to each of the tunable delay components in correspondence with relative timing of a set of arriving wavefronts at the input lines associated with the tunable delay components, wherein the set of arriving wavefronts temporally encode data in their relative delay; and
a read circuit connected to the tunable delay components such that an output signal can be controllably conducted through the tunable delay components so as to cause a set of memory recall wavefronts to be generated at the set of output lines having a relative delay corresponding to the relative delay of the set of arriving wavefronts.

2. The temporal memory of claim 1, wherein the group of tunable delay components comprises a plurality of memristor crossbars.

3. The temporal memory of claim 1, wherein the set of arriving wavefronts comprises a set of rising pulse edges, at least some of the rising pulse edges having a start time that is delayed relative to other rising pulse edges so as to encode data via such delays.

4. The temporal memory of claim 1, wherein the read circuit comprises an OR gate coupled to the set of output lines.

5. The temporal memory of claim 4, wherein the read circuit comprises a binary counter coupled to the OR gate.

6. The temporal memory of claim 4, wherein an output of the OR gate is coupled to at least one input line of the set of input lines.

7. The temporal memory of claim 6, wherein each of the set of output lines is coupled to at least one read/write circuit unit, the at least one read/write circuit unit comprising a read/write multiplexer and a level shifter.

8. The temporal memory of claim 7, wherein each of the set of input lines is coupled to at least one read/write circuit unit.

9. The temporal memory of claim 1, wherein the arriving wavefronts and memory recall wavefronts encode multiple bits.

10. The temporal memory of claim 9, wherein the number of the multiple bits is 4.

11. The temporal memory of claim 1, wherein energy cost per read operation of the temporal memory is decoupled from values stored in the group of tunable delay components.

12. A temporal memory comprising:
a group of tunable delay components in electrical communication with a set of input lines and a set of output lines, the group of tunable delay components configured to control relative timing of a set of arriving wavefronts to arrive at the input lines and to recall from the output lines;
a write circuit connected to the tunable delay components, the write circuit configured to encode the data in a temporal domain based on a set of relative delays of the set of arriving wavefronts; and
a read circuit connected to the tunable delay components, the read circuit configured to recall the set of arriving wavefronts with the set of relative delays at the output lines.

13. A temporal memory comprising:
a group of tunable delay components in electrical communication with a set of input lines and a set of output lines, wherein the group of tunable delay components comprises a plurality of memristor crossbars;
a write circuit connected to the tunable delay components such that an electrical signal can be controllably applied to each of the tunable delay components to temporally encode data based on a set of relative delays of a set of arriving wavefronts at the input lines; and
a read circuit connected to the tunable delay components such that an output signal can be controllably conducted through the tunable delay components to cause a set of memory recall wavefronts to be generated at the set of output lines having a relative delay corresponding to the set of relative delays of the set of arriving wavefronts.

* * * * *